(12) United States Patent
Wang et al.

(10) Patent No.: US 9,967,943 B1
(45) Date of Patent: May 8, 2018

(54) LIGHTING APPARATUS

(71) Applicant: XIAMEN ECO LIGHTING CO. LTD., Xiamen (CN)

(72) Inventors: Qiyuan Wang, Xiamen (CN); Wenchang Huang, Xiamen (CN); Guangai Chen, Xiamen (CN); Huiwu Chen, Xiamen (CN)

(73) Assignee: XIAMEN ECO LIGHTING CO. LTD., Xiamen (CN)

( * ) Notice: Subject to any disclaimer, the term of this patent is extended or adjusted under 35 U.S.C. 154(b) by 0 days. days.

(21) Appl. No.: 15/471,870

(22) Filed: Mar. 28, 2017

(30) Foreign Application Priority Data

Feb. 28, 2017 (CN) .......................... 2017 1 0114303

(51) Int. Cl.
| | |
|---|---|
| *H05B 33/08* | (2006.01) |
| *F21K 9/60* | (2016.01) |
| *F21K 9/238* | (2016.01) |
| *F21V 23/00* | (2015.01) |
| *H05B 37/02* | (2006.01) |
| *H01L 33/50* | (2010.01) |
| *H01L 25/075* | (2006.01) |
| *H01L 33/62* | (2010.01) |
| *F21Y 115/10* | (2016.01) |
| *F21Y 113/17* | (2016.01) |

(52) U.S. Cl.
CPC ......... *H05B 33/0857* (2013.01); *F21K 9/238* (2016.08); *F21K 9/60* (2016.08); *F21V 23/003* (2013.01); *H01L 25/0753* (2013.01); *H01L 33/502* (2013.01); *H01L 33/62* (2013.01); *H05B 33/0845* (2013.01); *H05B 37/0281* (2013.01); *F21Y 2113/17* (2016.08); *F21Y 2115/10* (2016.08)

(58) Field of Classification Search
CPC ............ H05B 33/0857; H05B 33/0845; H05B 37/0281; F21V 23/003
USPC ........ 315/151, 152, 185 R, 209 R, 291, 307, 315/308, 312
See application file for complete search history.

(56) References Cited

U.S. PATENT DOCUMENTS

| | | | |
|---|---|---|---|
| 8,742,695 B2* | 6/2014 | Wray ................. | H05B 33/0818 315/185 R |
| 8,786,200 B2* | 7/2014 | Tischler ............. | H05B 33/0827 257/98 |

\* cited by examiner

*Primary Examiner* — Jimmy Vu
(74) *Attorney, Agent, or Firm* — Chun-Ming Shih

(57) ABSTRACT

A lighting apparatus comprises the following elements. A first set of light emitting diode module includes a variety of light emitting diode elements, wherein different types of light emitting diode elements have different color temperature characteristics. A driving circuit supplies power to the first set of light emitting diode module, such that the plurality of light emitting diode elements emit light. Moreover, the driving circuit may supply currents with different total values, and the optical characteristics of the first set of light emitting diode module change accordingly, so as to change color temperatures.

17 Claims, 5 Drawing Sheets

LIGHTING APPARATUS

TECHNOLOGY FIELD

The present invention relates to a lighting apparatus, and particularly to a lighting apparatus capable of changing light emitting characteristics.

BACKGROUND

For the tens of millions years of evolution, human beings are sensitive to light. Nowadays, day and night are not seemingly different because of the popularity of lighting technology; however, people are still affected by the characteristics of light without awareness. For example, the experiments show that some people exhibit different degrees of concentration in the evening from the noon. Moreover, medical studies show that symptoms like over-anxiety and insomnia are relieved by controlling color temperature. However, lamps are capable of changing optical characteristics are still relatively expensive so far. If a lower-cost and effective lamp is manufactured, human lives may greatly be improved.

SUMMARY OF THE INVENTION

According to the first embodiment of the present invention, a lighting apparatus is provided. The lighting apparatus includes the following elements. The first set of LED module includes multiple types of LED units, different types of the LED unit having different color temperature characteristics; and a driving circuit supplying electricity to the first set of LED module for multiple types of LED units to emit light and when the driver circuit supplying a different total current, a color temperature change occurring in a light characteristic of the first set of LED module in response to a change in the total current. When the driving circuit supplies currents with different total values, the optical characteristics of the first set of light emitting diode module change accordingly, so as to change color temperatures. The color temperature characteristics of this type of light emitting diode elements may be adjusted, by manipulating the characteristics of the phosphors coated. There are multiple methods to accomplish white light emission for the light emitting diodes. The prior developed and industrialized method to accomplish white light emission is to coat the LED chip with phosphors. There are three major methods to accomplish white light emission for light emitting diodes adapting phosphors. Specifically, the first method is to coat a blue light emitting diode chip with yellow phosphor.

The yellow phosphor may be excited by the blue light emitted by the chip to emit yellow light. Then, the yellow light emitting by the yellow phosphor complements to the blue light emitted by the blue light emitting diode chip, so as to generate white light. The second method is to coat a blue light emitting diode chip with green phosphor and red phosphor. The green light and the red light emitted by the phosphors complex to the blue light emitted by the blue light emitting diode chip, so as to generate a better color gamut white light. The third method is to coat phosphors of three primary colors or multiple colors, to a violet or ultra-violet light emitting diode chip. By utilizing the long-wave ultra-violet light (370 nm-380 nm) or violet light (380 nm-410 nm) emitted by the light emitting diode chip, phosphors are excited, so as to generate a preferable color gamut white light emission. At present, the red and green phosphors with better conversion efficiency are mostly sulfide. In other words, different light characteristics may be adjusted by different phosphor compositions. In addition, in a further embodiment, the lighting apparatus may also include a second set of light emitting diode module. The second set of light emitting diode module also includes multiple types of light emitting diode elements. The different types of light emitting diode elements have different color temperature characteristics, and the driving circuit also supplies current to the second set of light emitting diode module. In addition, the second set of light emitting diode module may further include an auxiliary electronic element, such as a resistor. The driving circuit supplies electrical power to the first set of light emitting diode module and the second set of light emitting diode module, so as to allow the first type of light emitting diode elements and the second type of light emitting diode elements to emit light. In addition, when the driving circuit supplies currents with different total values, the auxiliary electronic element affects the relative current ratio received by the first set of light emitting diode module and the second set of light emitting diode module. In other words, in such a lighting apparatus, we may adjust the light emitting characteristics of the first set of light emitting diode module and the second set of light emitting diode module, by varying the total current supplied by the driving circuit as well as the different brightness varying speeds.

In some embodiments, the driving circuit converts the indoor power source into a voltage range suitable for driving the light emitting diode elements, so as to supply electrical power to the first set of light emitting diode module and the second set of light emitting diode module. In some embodiments, the auxiliary electronic element includes a resistor. In other words, the auxiliary electronic element may be a resistor having a specific resistance value, or it may be a simple circuit combination including a resistor. In some embodiments, the first set of light emitting diode module also includes a supplemental electronic element. The supplemental electronic element has different circuit characteristics from the auxiliary electronic element, and they affect the relative current ratio received by the first set of light emitting diode module and the second set of light emitting diode module. In other words, the supplemental electronic element and the auxiliary electronic element may alternately and jointly affect the final light changing characteristics. In some embodiments, the auxiliary electronic element is packaged with the second type of light emitting diode elements. In some embodiments, the first spectral characteristic and the second spectral characteristic are optical properties for color temperature. Color temperature is a physical quantity used in lighting optics to define the color of a light source. That is, to heat up a blackbody to a certain temperature, when the light emitted by the blackbody has the same color with the light emitted by a light source, the blackbody heating temperature is called the temperature of the color of the light source, referring as color temperature. The unit is expressed in "K" (Kelvin temperature unit). In photography, video, publishing and multiple other fields, color temperature is an important application character of visible light. The color temperature of a light source is determined by comparing its color and a theoretical hot blackbody radiator. When the color of the hot blackbody radiator matches the color of the light source, the Kelvin temperature of the hot blackbody is referred as the color temperature of the light source, which is directly related to the law of Planck's blackbody radiation. Color temperature is the most common indicator of the spectral quality of the light source. It is generally symbolized as Tc. The color temperature is defined by absolute blackbody, when the absolute blackbody's radiation and the light source are exactly the same in the visible spectrum, the temperature of the blackbody is called the color temperature of the light source. Low color temperature light source is characterized by having relatively more red radiations in the energy distribution, and is often referred as "warm light". When the color temperature increases, the proportion of blue radiations increase in the energy distribution, and is often referred as "cold light". Some of the commonly used light source color temperatures are: standard candle light for 1930K (Kelvin temperature unit); tungsten lamp for 2760-2900K; fluorescent lamp for 6400K; flash light for 3800K; noon sun for 5000K; electronic flash light for 6000K; blue sky for 10000K. In other words, we may change the overall color temperature of the lighting apparatus by adjusting currents.

In some embodiments, when the driving circuit supplies different total current values to the first set of light emitting diode module and the second set of light emitting diode module, the speed of brightness change proportion in the first set of light emitting diode module differ from that of the second set of light emitting diode module. Therefore, the overall combined spectral characteristics vary with the different total current values. In addition, in further embodiments, when the total current value decreases, the color temperature of the overall spectral characteristic transits from high color temperature to low color temperature. Moreover, by adjusting the characteristics of the first type of phosphor and the second type of phosphor as well as the circuit characteristics of the auxiliary electronic element, we may simulate the color temperatures changes form daytime to evening, when the total current value decreases. In another embodiment, the driving circuit has multiple default options corresponding to different total current values, so as to allow users to select a different overall spectral characteristic. In example, the lighting apparatus may be disposed with different buttons or toggle switches, allowing users to choose their own lighting needs from several default color temperatures or other combinations of optical properties. Once the users have made their choices, the driving current produces corresponding current, so as to generate corresponding lighting characteristics. In some embodiments, the driving circuit includes a time control circuit. Followed by a predetermined timeline, the total current value decreases gradually, so as to change the overall spectral characteristics accordingly. In other words, the lighting apparatus may be automatically simulated to the real changes of the color temperatures over time. Moreover, users may adjust the timeline according to their needs or designed requirements. In some embodiments, the first set of light emitting diode module and the second set of light emitting diode module are assembled into a module. The module includes two electrodes, so as to electrically connect to the driving circuit. The module may be an elongated strip in shape. In some further embodiments, one of the lighting apparatus includes multiple the modules. The modules may be connected in parallel, in series, or in the combination thereof. The modules are supplied with electrical power uniformly by the driving circuit.

In some further embodiments, the lighting apparatus further includes a bulb shell enclosing the module. Furthermore, multiple modules may be arranged in a non-parallel manner in the accommodating space of the bulb shell. This may better handle the heat dissipation issue and the overall lighting efficiency. In addition, in some embodiments, the plurality types of light emitting diode elements are alternatively arranged. Therefore, different types of light emitting diode elements are evenly distributed, in order to generate a uniform light source. Moreover, in some embodiments, the overall color temperature characteristics of the lighting apparatus are determined by adjusting the relative numbers and ratios of the plurality of light emitting diode elements. According to such an embodiment, it is possible to provide a lighting apparatus having a low cost, a high stability and a diversified usage, so as to improve people's life.

DETAILED DESCRIPTION

Figure 1:
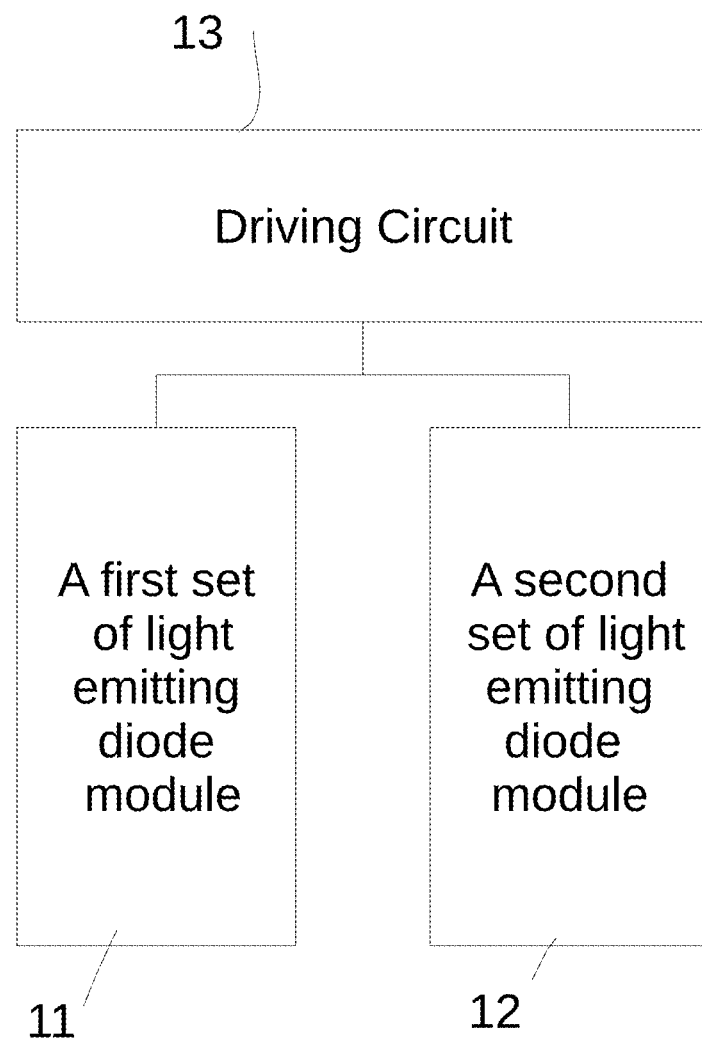
FIG. 1 is an exemplary embodiment of a circuit of a lighting apparatus in accordance with the present invention.

Please refer to FIG. 1, FIG. 1 illustrates a schematic diagram of a circuit of a lighting apparatus according to an embodiment of the present invention. The lighting apparatus includes the following elements.

The first set of light emitting diode module 11 includes at least two light emitting diode elements. The surfaces of different types of light emitting diode elements are covered by different phosphors.

The second set of light emitting diode module 12 also includes at least two light emitting diode elements and an auxiliary electronic element. The surfaces of different types of light emitting diode elements are covered by different phosphors.

There are multiple methods to accomplish white light emission for light emitting diode. A prior developed and industrialized method to accomplish white light emission is to coat the LED chip with phosphors. There are three major methods to accomplish white light emission for light emitting diodes adapting phosphors. Specifically, the first method is to coat a blue light emitting diode chip with yellow phosphor. The yellow phosphor may be excited by the blue light emitted by the chip to emit yellow light. Then, the yellow light emitted by the yellow phosphor complements to the blue light emitted by the blue light emitted diode chip, so as to generate white light.

The second method is to coat a blue light emitting diode chip with green phosphor and red phosphor. The green light and the red light emitted by the phosphors complex to the blue light emitted by the blue light emitting diode chip, so as to generate white light with better color gamut. The third method is to apply phosphors of three primary colors or multiple colors, to a violet or ultra-violet light emitting diode chip. By utilizing the long-wave ultraviolet light (370 nm-380 nm) or violet light (380 nm-410 nm), phosphors are excited, so as to generate white light emission with preferable color gamut. At present, the red and green phosphors with better conversion efficiency are mostly sulfide. In other words, different light characteristics may be adjusted by different phosphor elements.

The driving circuit 13 supplies electrical power to the first set of light emitting diode module 11 and the second set of light emitting diode module 12, such that the first type of light emitting diode elements and the second type of light emitting diode elements emit light. In addition, when the driving circuit supplies different total current values, the auxiliary electronic element affects the relative current ratio received by the first set of light emitting diode module 11 and the second set of light emitting diode module 12. In other words, in the lighting apparatus, we may adjust the lighting characteristics of the first set of light emitting diode module 11 and the second set of light emitting diode module 12, by varying the total currents supplied by the driving circuit 13 as well as the changing speeds of different brightness.

Figure 2:
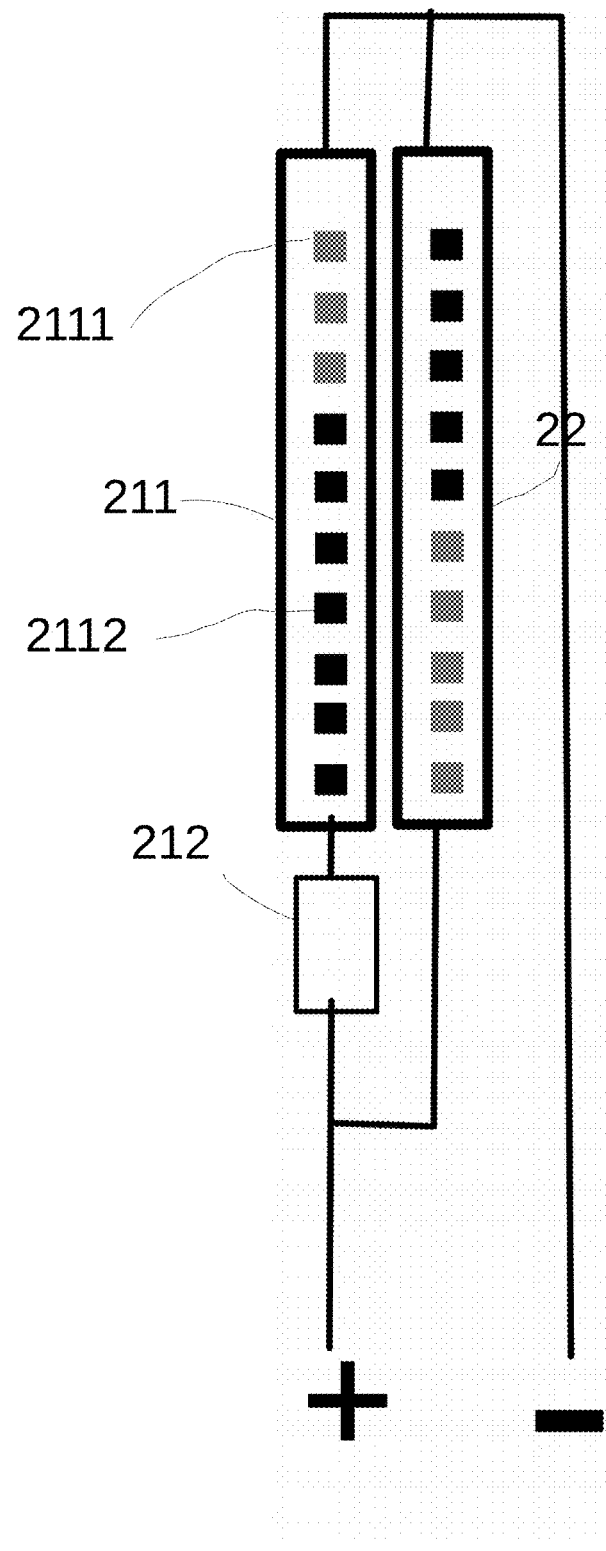
FIG. 2 is an exemplary embodiment illustrating the elements.

Please refer to FIG. 2, FIG. 2 illustrates a schematic diagram of elements according to an embodiment of the present invention.

FIG. 2 is a schematic diagram of a circuit of a light emitted module, which may be manufactured as a module element. In FIG. 2, the first set of light emitting diode module 211 has two different light emitting diode elements 2111 and 2112. Likewise, a second set of light emitting diode module 22 may also be included of two different light emitting diode elements. Although two light emitting diode elements are illustrated here, it is possible to expand to three or more light emitting diode elements. These different light emitting diode elements may be completely different, or may be surface coated with different phosphors. The resistor 212, as the auxiliary electronic element, may adjust the first set of light emitting diode module 211 and the second set of light emitting diode module 22 to have different current change rates as the total current changes.

Figure 3:
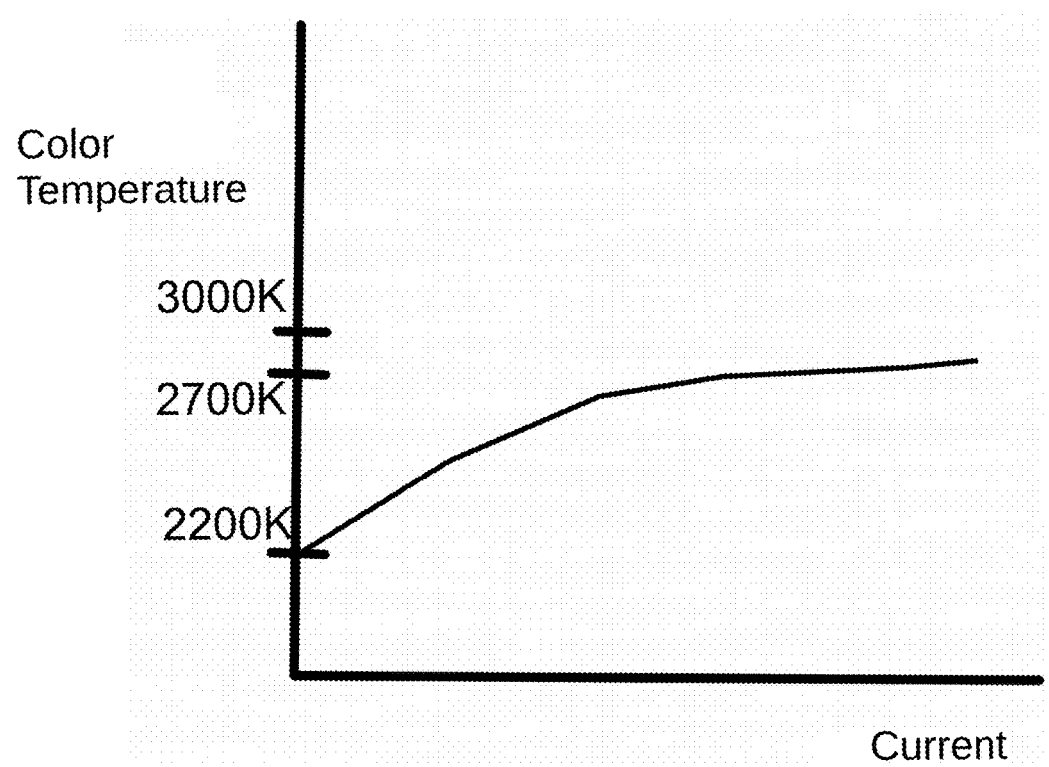
FIG. 3 illustrates the changes of the color temperature and the current

Please refer to FIG. 3, FIG. 3 illustrates the changes of the color temperature and the current. As described above, by adjusting the phosphor characteristics, the characteristics of the first set of light emitting diode module and the second set of light emitting diode module may be determined. In consequence, the color temperatures of the first set of light emitting diode module and the second set of light emitting diode module may be determined accordingly. In addition, by adjusting the circuit characteristics of the auxiliary electronic element, we may further adjust the relative current change ratio of the first set of light emitting diode module to the second set of light emitting diode module. FIG. 3 illustrates the changes of the mixed color temperature of the first set of light emitting diode module and the second set of light emitting diode module, when the driving circuit supplies different total currents.

In some embodiments, the driving circuit converts the indoor power source into a voltage range suitable for driving the diode light emitting element, so as to supply electrical power to the first set of light emitting diode module and the second set of light emitting diode module.

In some embodiments, the auxiliary electronic element includes a resistor. In other words, the auxiliary electronic element may be a resistor having a specific resistance value, or a simple circuit combination including a resistor.

In some embodiments, the first set of light emitting diode module also includes a supplemental electronic element. The complementary electronic element has different circuit characteristic from the auxiliary electronic element, so as to affect the relative current ratio received by the first set of light emitting diode module and the second set of light emitting diode module. In other words, the supplemental electronic element and the auxiliary electronic element may alternately and jointly affect the final light change characteristic. In some embodiments, the auxiliary electronic element is packaged with the second type of light emitting diode elements.

In some embodiments, the first spectral characteristic and the second spectral characteristic are optical properties for color temperature. Color temperature is a physical quantity used in lighting optics to define the color of the light source. That is, to heat up a blackbody to a certain temperature, when the light emitted by the blackbody has the same color with the light emitted by a certain light source, the black body heating temperature is called the temperature of the color of the light source, referring as color temperature. The unit is expressed in "K" (Kelvin temperature unit). In photography, video, publishing and multiple other fields, color temperature (colo(u)r temperature) is an important application character of visible light. The color temperature of a light source is determined by comparing its color and a theoretical hot blackbody radiator. When the color of the hot blackbody radiator matches the color of the light source, the Kelvin temperature of the hot blackbody is referred as the color temperature of the light source, which is directly related to the law of Planck's blackbody radiation. Color temperature is the most common indicator of the spectral quality of the light source. It is generally symbolized as Tc. The color temperature is defined by absolute blackbody, when the absolute blackbody's radiation and the light source are exactly the same in the visible spectrum; the temperature of the blackbody is called the color temperature of the light source. Low color temperature light source is characterized by having relatively more red radiations in the energy distribution, and is often referred as "warm light". When the color temperature increasing, the proportion of blue radiations increases in the energy distribution, and is often referred as "cold light". Some of the commonly used light source color temperature are: standard candle light for 1930K (Kelvin temperature unit); tungsten lamp for 2760-2900K; fluorescent lamp for 6400K; flash light for 3800K; noon sun for 5000K; electronic flash light for 6000K; blue sky for 10000K. In other words, we may change the overall color temperature of the lighting apparatus by adjusting currents.

In some embodiments, when the driving circuit supplies different total current values to the first set of light emitting diode module and the second set of light emitting diode module, the speed of brightness change proportion in the first set of light emitting diode module differ from that of the second set of light emitting diode module. Therefore, the overall combined spectral characteristics vary with the different total current values. In other embodiments, when the total current value decrease, the color temperature of the overall spectral characteristic transits from high color temperature to low color temperature.

Moreover, by adjusting the characteristics of the first type of phosphor and the second type of phosphor as well as the circuit characteristics of the auxiliary electronic element, we may simulate the color temperatures changes form daytime to evening, when the total current value decreases. In another embodiment, the driving circuit has multiple default options corresponding to different total current values, so as to allow users to select a different overall spectral characteristic. In example, the lighting apparatus may be disposed with different buttons or toggle switches, allowing users to choose their own lighting needs from several default color temperatures or other combinations of optical properties. After the users have made their choices, the driving current produces corresponding current, so as to generate corresponding lighting characteristics.

In some embodiments, the driving circuit includes a time control circuit. Followed by a predetermined timeline, the total current value decrease gradually, so as to change the overall spectral characteristics accordingly. In other words, the lighting apparatus may be automatically simulated to the real changes of the color temperatures over time. Moreover, users may adjust a time schedule according to their needs or designed requirements. In some embodiments, the first set of light emitting diode module and the second set of light emitting diode module are assembled into a module. The module includes two electrodes, so as to electrically connect to the driving circuit. The module may be an elongated strip in shape.

Please refer to FIG. 4A, FIG. 4B, FIG. 4C and FIG. 4D. FIG. 4A, FIG. 4B, FIG. 4C and FIG. 4D illustrate exemplary embodiments of combining different light emitting diodes elements.

Figures 4A, 4B:
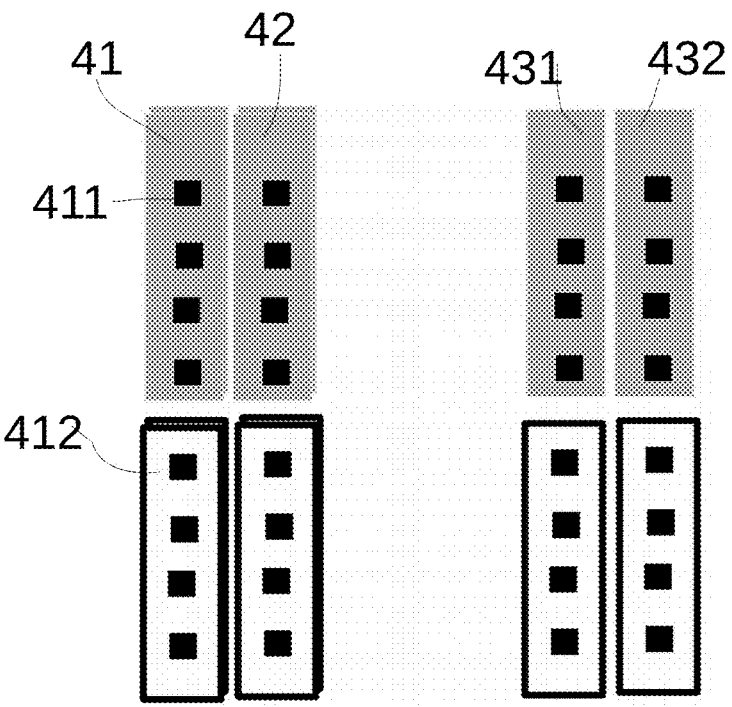
FIG. 4A, FIG. 4B, FIG. 4C and FIG. 4D illustrate exemplary embodiments of combining different light emitting diodes elements.
Figures 4C, 4D:
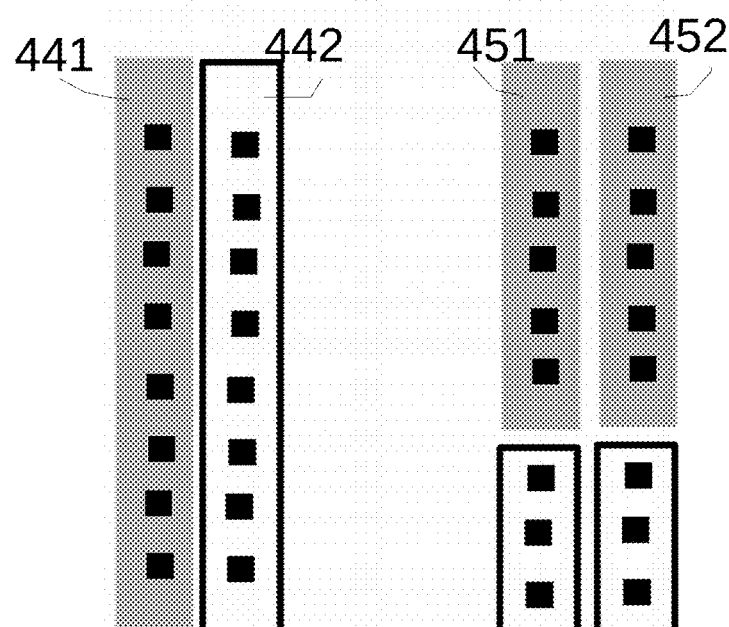

In FIG. 4A, the first set of light emitting diode module 41 includes two different light emitting diode elements 411 and 412. The two different light emitting diode elements 411 and 412 are arranged at the top and the bottom, respectively. Likewise, the second set of light emitting diode module also includes two different light emitting diode elements. In this example, the upper half is the first light emitting diode element, while the lower part is the second light emitting diode element. Then, in FIG. 4B, FIG. 4C, and FIG. 4D further include a first light emitting diode module 431, 441, 451 and a second set of light emitting diode modules 432, 442, respectively. The two light emitting diode elements described above may be arranged in different proportions and positions, so as to adjust the desired light emitting characteristics.

In addition to use two types of light emitting diode elements, three or more light emitting diode elements may be applied. Furthermore, the arranging order may be more staggered, so as to better perform a more uniform mixing result.

Figure 5:
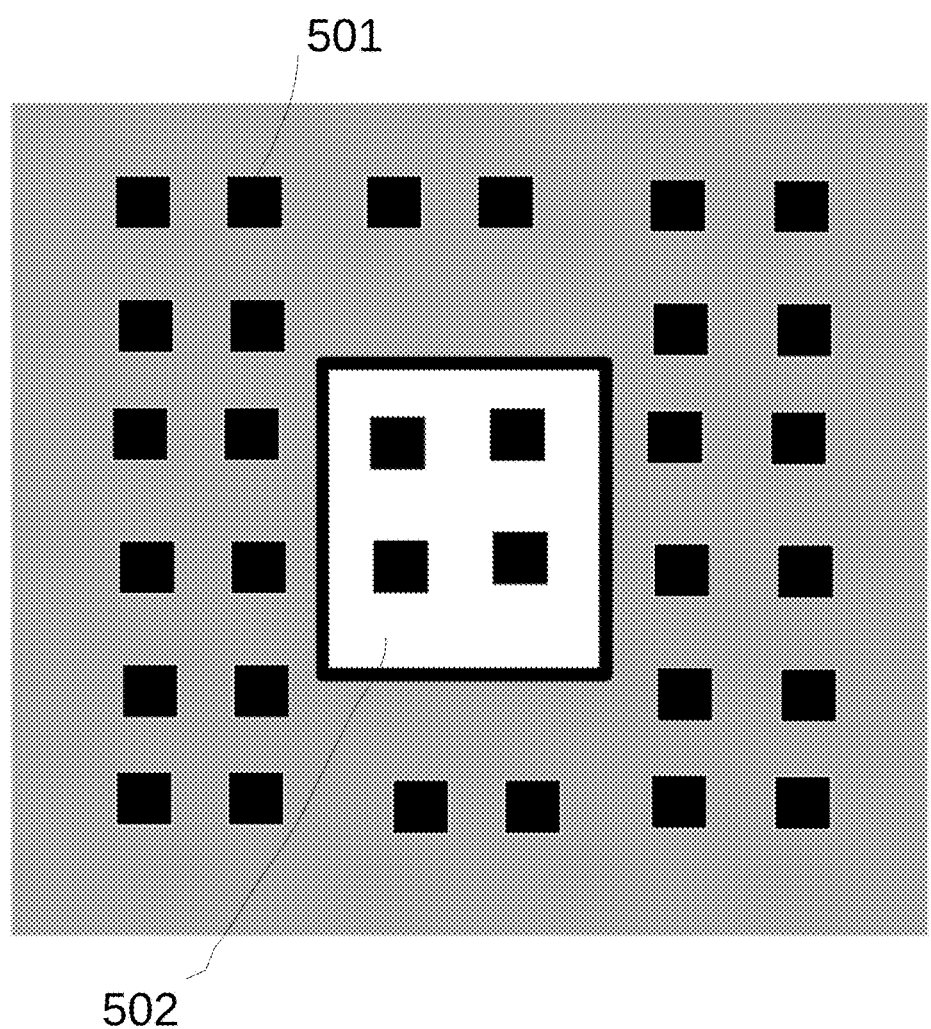
FIG. 5 illustrates another exemplary embodiment of combining different light emitting diodes elements.

FIG. 5 provides another exemplary embodiment. In FIG. 5, the two light emitting diode elements 501, 502 are arranged in a light emitting diode module in a predetermined manner. In other words, various shapes of light emitting diode modules may be designed. Moreover, the wires of the same kind of light emitting diode elements may be connected by winding, and further connect to the auxiliary electronic element, such as a resistor, in series. By doing this, total current may also be adjusted, so as to change the color temperature. In addition to the above examples, other modifications and variations are intended to be within the scope of the present invention as defined by the present invention.

The invention claimed is:

1. A lighting apparatus, comprising:
a first set of LED module comprising a plurality of types of LED units, different types of the LED unit having different color temperature characteristics;
a driving circuit supplying electricity to the first set of LED module for the plurality of types of LED units to emit light and when the driver circuit supplying a different total current, a color temperature change occurring in a light characteristic of the first set of LED module in response to a change in the total current; and
a second set of light emitting diode module, wherein the second set of light emitting diode module also comprises a plurality of types of light emitting diode elements in which the different types of light emitting diode elements have different color temperature characteristics; and the driving circuit also provides current to the second set of light emitting diode module,
wherein the second set of light emitting diode module further comprises an auxiliary electronic component, when the driving circuit supplies different total current values, the auxiliary electronic element affects the relative current ratio is received by the first set of light emitting diode module and the second set of light emitting diode module, and
wherein when the driving circuit supplies different total current values to the first set of light emitting diode module and the second set of light emitting diode module, the speed of brightness changes proportion in the first set of light emitting diode module differ from that of the second set of light emitting diode module, so as to vary the overall is combined spectral characteristics accordingly.

2. The lighting apparatus of claim 1, wherein the auxiliary electronic component comprises a resistor.

3. The lighting apparatus of claim 1, wherein when the total current value decreases, the color temperature of the overall spectral characteristic transits from high color temperature to low color temperature.

4. The lighting apparatus of claim 1, wherein the first set of light emitting diode module also comprises a supplemental electronic element in which the supplemental electronic element has different circuit characteristics from the auxiliary electronic element, and they affect the relative current ratio is received by the first set of light emitting diode module and the second set of light emitting diode module.

5. The lighting apparatus of claim 4, wherein adjusts the circuit characteristics of the auxiliary electronic element, the color temperatures changes form daytime to evening may be simulated, while the total current value decreases.

6. The lighting apparatus of claim 1, wherein the driving circuit has a plurality of default options corresponding to different total current values, so as to allow users to select a different overall spectral characteristic.

7. The lighting apparatus of claim 1, wherein the driving circuit comprises a time control circuit with a predetermined timeline to allow the total current value decreases gradually, so as to change the overall spectral characteristics accordingly.

8. The lighting apparatus of claim 1, wherein the first set of light emitting diode module and the second set of light emitting diode module are assembled into a module, and the module comprises two electrodes so as to electrically connect to the driving circuit.

9. The lighting apparatus of claim 8, wherein the module is an elongated strip in shape.

10. The lighting apparatus of claim 9, wherein one of the lighting apparatus comprises a plurality of the modules connected in parallel, and the modules are supplied with electrical power uniformly by the driving circuit.

11. The lighting apparatus of claim 9, wherein one of the lighting apparatus comprises a plurality of the modules connected in series, and the modules are supplied with electrical power uniformly by the driving circuit.

12. The lighting apparatus of claim 9, further comprising a bulb shell enclosing the module.

13. The lighting apparatus of claim 12, wherein a plurality of the modules is arranged in a non-parallel manner in the accommodating space of the bulb shell.

14. The lighting apparatus of claim 1, wherein the color temperature characteristics of the light emitting diode elements are adjusted by manipulating the characteristics of the phosphors coated.

15. The lighting apparatus of claim 1, wherein the driving circuit converts the indoor power source into a voltage range suitable for driving the light emitting diode elements, so as to supply electrical power to the first set of light emitting diode module and the second set of light emitting diode module.

16. The lighting apparatus of claim 1, wherein the plurality types of light emitting diode elements are alternatively arranged, thus different types of light emitting diode elements are evenly distributed, so as to generate a uniform light source.

17. The lighting apparatus of claim 1, wherein the overall color temperature characteristics of the lighting apparatus are determined by adjusting the relative numbers and ratios of the plurality of light emitting diode elements.

* * * * *